United States Patent [19]

Niblock

[11] Patent Number: 4,981,385
[45] Date of Patent: Jan. 1, 1991

[54] RELEASABLE FASTENER
[75] Inventor: Michael R. Niblock, London, England
[73] Assignee: Poppapin Limited, London, England
[21] Appl. No.: 386,657
[22] Filed: Jul. 31, 1989
[51] Int. Cl.$^5$ ............................................... B42F 3/00
[52] U.S. Cl. ............................................ 402/8; 402/1
[58] Field of Search ...................... 402/8, 9, 48, 43, 1, 402/5, 24, 25, 58, 501, 502; 101/415.1

[56] References Cited

U.S. PATENT DOCUMENTS

| | | | |
|---|---|---|---|
| 1,358,265 | 11/1920 | Umanoff | 402/8 |
| 2,543,144 | 3/1946 | Wold | 402/8 |
| 3,276,450 | 10/1966 | Pelezzare | 129/1 |
| 3,757,389 | 9/1973 | Wiland | 402/1 |
| 4,380,956 | 4/1983 | Elworthy | 101/401.1 |
| 4,533,240 | 8/1985 | Jasperson | 355/125 |
| 4,693,624 | 9/1987 | Moosmüller | 402/6 |

FOREIGN PATENT DOCUMENTS

| | | |
|---|---|---|
| 518608 | 10/1981 | Australia . |
| WO81/00381 | 2/1981 | PCT Int'l Appl. . |
| 948465 | 9/1960 | United Kingdom . |
| 1076254 | 12/1962 | United Kingdom . |
| 2114647 | 8/1983 | United Kingdom . |
| 2122678 | 8/1983 | United Kingdom . |

Primary Examiner—Douglas D. Watts
Assistant Examiner—Thomas Hamill, Jr.
Attorney, Agent, or Firm—Lowe, Price, LeBlanc, Becker & Shur

[57] ABSTRACT

A fastening device is disclosed for releasably securing together a plurality of sheet or plate members assembled in face-to-face or back-to-back contact, the sheet or plate members being provided with correspondingly positioned, shaped and dimensioned registration apertures. The fastener comprises first and second fastening portions spaced apart along an elongate flexible connector element, such fastening portions being positionable from opposite sides of the assembly of sheet or plate members with the connector element extending over an edge of the assembly, said fastening portions being releasably interconnectable, with a spigot element of one of them projecting through and engaging in the aligned apertures to inhibit relative movement of the sheet or plate members.

There is also disclosed a method of releasably securing together a plurality of printing plates having registration apertures using a fastening element passing through a set of aligned apertures.

5 Claims, 3 Drawing Sheets

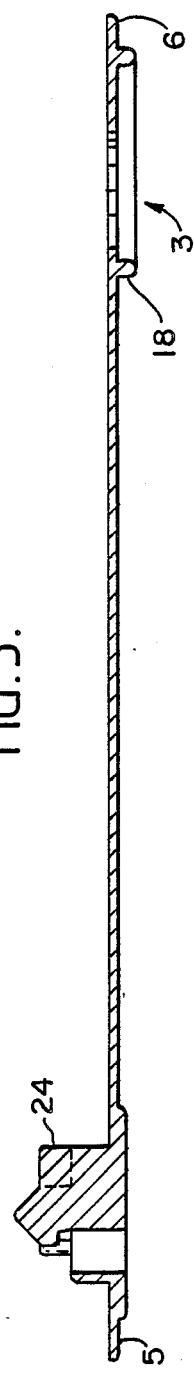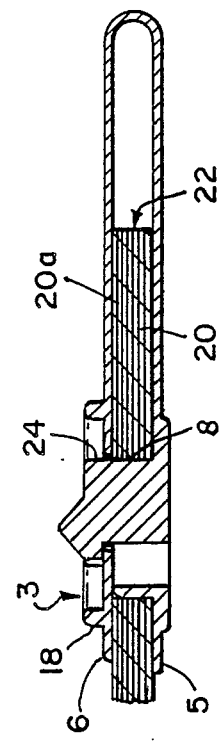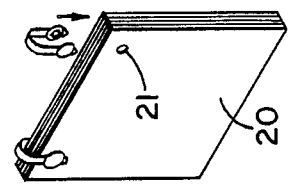

RELEASABLE FASTENER

FIELD OF THE INVENTION

This invention relates to releasable fasteners for securing together a plurality of sheet or plate members. The fastener of the invention is particularly, but not exclusively, suitable for securing together two or more colorlithographic printing plates or the sheets of photographic film used in the photolithographic process for making the plates. The invention also concerns a method for releasably securing together a plurality of such lithographic printing plates or sheets of film.

BACKGROUND OF THE PRIOR ART

A colorlithographic printing process involves the transfer onto an image receptor sheet of a plurality of different color components of the required image. The ink for each successive image component is transferred by an offset process, the initial ink pattern being formed on the surface of a specially prepared lithographic plate in the form of a thin metallic sheet secured onto the surface of a carrier roller. To ensure that the successive image components are transferred with exact positional accuracy to provide a sharp composite image, it is known to provide the printing machine with means to locate the printing plates correctly on their respective support rollers. Such locating means normally comprises projections which engage in preformed registration apertures in the printing plates. The equipment used by the printing plate maker is suitably adapted to punch these registration holes in an accepted standard format according to the type of printing machine for which the plates are intended, and also to form the respective color component print patterns in correct positional relationship with these punched registration holes.

For transport from the plate maker to the printer, each set of plates is assembled as a stack and secured together. This is normally done using pieces of adhesive tape secured at the corners of the stack, but this somewhat crude technique has certain drawbacks. Firstly, the tape must be very carefully applied otherwise the plate may not be sufficiently firmly secured together to prevent face-to-face sliding of the plates which causes damage to the image patterns carried on the faces of the plates. Accordingly, this adhesive tape method is time-consuming and awkward to perform. Secondly, the tape often splits during transport, allowing such sliding to occur, with the above-noted undesirable results. Thirdly, the tape must be completely removed by the printer otherwise printing errors may occur; this tape removal is again a time-consuming and awkward job to perform.

After printing, the printer will normally store the printing plates, and once again each set of plates may for convenience of storage be secured together, for which purpose the above-mentioned troublesome adhesive tape method is normally employed.

The process used by the plate maker for making the printing plates is a photographic process involving the use of sheets of photographic film. These sheets, or transparent carrier sheets on which they are mounted, are also punched with registration holes, to ensure correct relative positioning of the plates and films during the process, and the above-noted problems of securing the sets of films together for transport and storage are commonly encountered.

SUMMARY OF THE INVENTION

The present invention aims to alleviate these problems and to that end provides in one aspect a method of releasably securing together a plurality of printing plates or photographic film sheets each provided with a plurality of registration apertures for location of the plate or film sheet in a printing apparatus, the method comprising assembling the plates or film sheets with their corresponding apertures aligned and attaching a respective fastening element with a mounting portion thereof passing through a respective set of said aligned apertures.

The invention also provides a fastening device for releasably securing together a plurality of sheet or plate members assembled in face-to-face or back-to-back contact, said sheet or plate members being provided with correspondingly positioned, shaped and dimensioned registration apertures, the fastener comprising first and second fastening portions spaced apart along an elongate flexible connector element, said fastening portions being positionable from opposite sides of the assembly of sheet or plate members with said connector element extending over an edge of the assembly, said fastening portions being releasably interconnectable, with a spigot element of one of them projecting through and engaging in the aligned apertures to inhibit relative movement of the sheet or plate members.

In a described embodiment, the fastening device is a one-piece element integrally moulded from a suitable plastics material such as polypropylene. One of the fastening portions is integrally formed with the spigot element and also with an attachment pin engagable by snap-action in a corresponding aperture formed in the other fastening portion Preferably, the spigot element has a first, circumferentially continuous wall portion for engaging in the aligned apertures of the sheet or plate members, and a second retaining portion comprising a plurality of elements extending away from the first portion in a direction transverse to the plane of the plates and having radially outer edges or surfaces which continue in said direction from said wall portion, said aperture in said second fastening portion having aperture portions for receiving said elements of the second portion of the spigot element, the arrangement thereby being such as to be devoid of any gap between the spigot element and the second fastening portion into which one or more aperture edges of the plate could slip.

BRIEF DESCRIPTION OF THE DRAWING

Preferred embodiments of the invention will now be described by way of example with reference to the accompanying drawings, in which:

FIG. 3 is a longitudinal sectional view of the fastening device of FIG. 1, taken on line III—III;

FIG. 4 is a perspective view of a set of printing plates secured together with two fastening devices of the kind illustrated in FIGS. 1 to 3;

FIG. 5 is a sectional view through a fastening device of FIGS. 1 to 3 as used to secure together a set of printing plates; and FIG. 6 illustrates schematically a different way of suspending a set of printing plates or films secured together by a pair of such fastening devices.

DESCRIPTION OF THE PREFERRED EMBODIMENT

Figure 1:
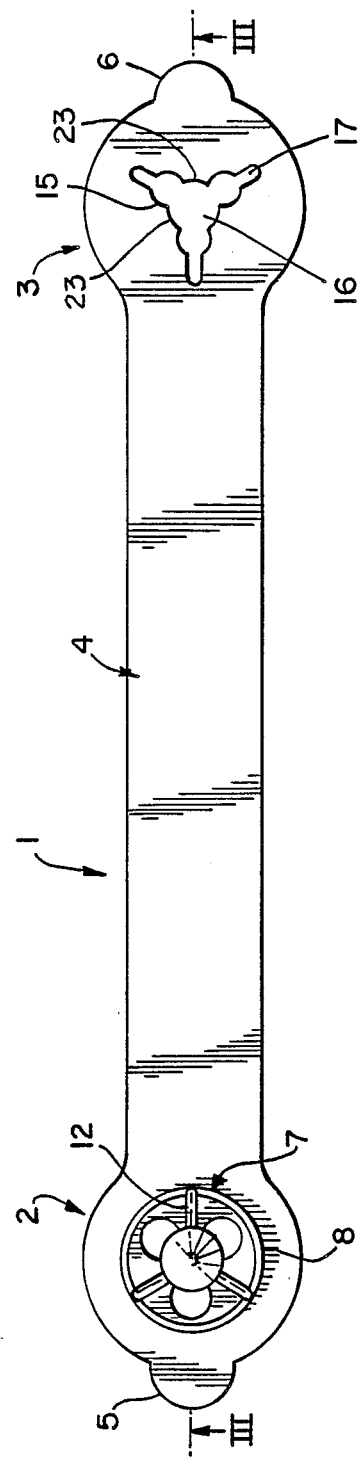
FIG. 1 is a plan view of a fastening device according to a preferred embodiment of the present invention.
Figure 2:
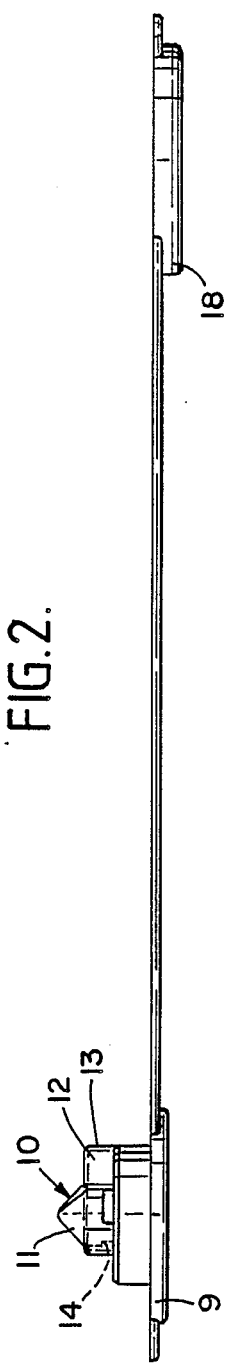
FIG. 2 is a side view of the fastening device shown in FIG. 1.

With reference to FIGS. 1 to 3, a fastener according to the invention comprises a one-piece element, preferably injection molded from a plastics material, e.g., polypropylene, and comprises first and second fastening portions in the form of head members 2 and 3 respectively, interconnected by a connector member in the form of an elongate flexible connecting strip 4. Each head member is generally circular, and is formed with a respective end tag 5, 6, the purpose of which will become clear as the description proceeds.

The first head member 2 comprises a base 9 integrally formed with a spigot 7 including a cylindrical wall 8 projecting with its axis perpendicular to that of the base 9. The head member 2 is also integrally formed with a fastening peg or pin 10 projecting perpendicularly from the base 9 beyond a chamfered rim 8a of the cylindrical wall 8, as can be best seen in FIG. 2. This pin 10 is disposed radially inwardly of the wall 8 and is formed with a tapered head portion 11.

The spigot 7 also includes three radially disposed, equally circumferentially spaced restraining web elements 12 which project from the base 9 and are integrally joined at their radially inner portions to the central pin 10 and at their radially outer portions to the cylindrical wall 8. The radially outer edges 13 of these elements 12 are, as can be seen from FIG. 2, continuous with the sectional profile of the wall 8.

Each of the three circumferential portions of the pin 10 between adjacent web elements 12 has an undercut 14.

The second head member 3 is formed with an aperture 15 having a generally circular central portion 16 and three radially disposed, equally circumferentially spaced arms 17. On the side of the head member 3 which, in the flat condition of the device shown in FIGS. 1 and 2, is on the side opposite to that of the spigot 7, there is formed a cylindrical wall 18 encircling the aperture 15.

With reference to FIG. 4 of the drawings, a device described above with reference to FIGS. 1 to 3 is employed to secure together a stack of lithographic printing plates or photographic films 20 assembled with their registration holes 21 aligned. To secure the fastener, the spigot 7 of the first head member is pushed into the aligned holes 21 from one side of the stack until the base 9 comes into engagement with the outer face of the plate on that side; the height H of the cylindrical wall 8 is preferably slightly greater than the combined thickness of five standard printing plates this being the number in a standard color lithographic plate set so that it will just project from the other side of the stack, as shown in FIG. 5. In one preferred embodiment for use with plates of 0.5 mm thickness this dimension H is approximately 3.3 mm. In fact, a device with this magnitude of dimension H would accommodate a stack of up to seven such plates. The flexible connector 4 is then bent round the edge 22 of the stack of plates or films and the head member 3 is pushed onto the projecting head 11 of the pin 10 and portions 12 of the spigot. The arms 17 of the aperture 16 are correspondingly positioned with the retaining members 12 so as to accommodate them when the two head members are thus pushed together. Each pair of circumferentially adjacent arms 17 defines between them a respective flexible lip 23 which flexes outwardly as it rides down the surface of the conical head 11 during this attachment process, and eventually snaps back into the corresponding undercut 14. The diameter of the circular central portion 16 of the aperture 15 is smaller than the overall outer diameter of the pin 10 and accordingly the lips 23 engage tightly in the undercuts 14 to retain the fastener in the securing position shown in FIG. 5.

The tags 5 and 6 facilitate manual separation of the second head member 3 from the pin 10, and subsequent removal of the first head member 2 from the aligned apertures 21 of the printing plates.

It will be seen that the fastener not only holds the printing plates together, but also inhibits any face-to-face sliding between them, which sliding could otherwise damage the component image patterns on their surfaces. This inhibition of sliding is accomplished by making the outer diameter of the spigot substantially the same as the diameter of the apertures 21. Furthermore, since the radial projection of the three retaining webs 12 corresponds with the radius of the cylindrical wall 8, their outer edges 24 are contiguous with the sectional profile of the wall 8 as can be seen in FIG. 5. Since these members 24 project right through the second head member 3 there is no possibility of the aperture edge portion of the plate 20a sliding between the chamfered upper rim 8a of the cylindrical wall 8 and the underface of the head member 3.

Figure 7:
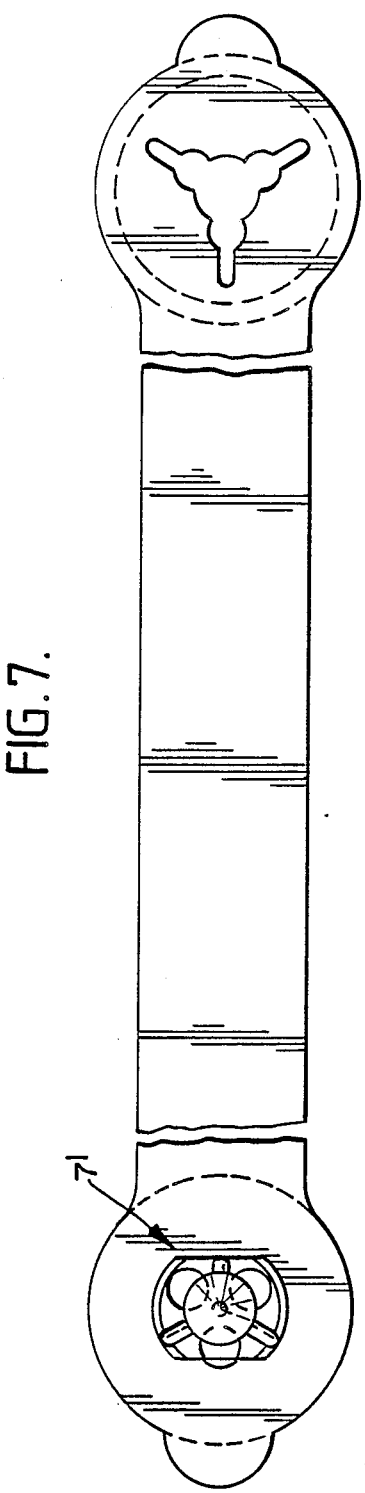
FIG. 7 is a plan view of a modified form of fastening device.

In the fastened position shown in FIG. 4, the two fasteners 1 provide a pair of loops by which the printing plate stack may be suspended from a storage hanging bar 26, as illustrated in FIG. 6. FIG. 7 shows a modified form of fastener having a form of spigot 7' specially adapted to pass through a well-known form of non-circular registration aperture commonly used in lithographic printing techniques as a variant to the circular aperture.

Clearly, the shape of the spigot can be adapted for any shape of registration aperture.

It will be appreciated that the above-described fastener is quick and easy to use and provides a secure and efficient means for releasably fixing printing plates together using an existing characteristic feature of such plates, namely the registration apertures.

Although the present invention has been described in terms of a fastener device for printing plates, it will be appreciated that the disclosed device, or modified forms thereof may be used for securing other kinds of perforated sheet or plate members, e.g. paper sheets.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

I claim:

1. A fastening device for releasably securing together a stack of sheet members assembled in face-to-face contact, said sheet members being provided with correspondingly positioned, shaped and dimensioned preformed apertures, comprising:

an integrally formed one-piece element which includes first and second spaced-apart fastening portions; and an elongate, flexible strip-like connector element interconnecting said first and second fastening portions, said first fastening portion comprising a generally flat first base portion coplanar with the strip-like connector element, a spigot which projects perpendicularly from one face of said first base portion and which has a peripheral surface for engagement with inside edges of said apertures of said sheet members and a top rim spaced by the height of the spigot from the first base portion, and an attachment pin projecting perpendicularly from said one face of said first base portion coaxially with said spigot and by a distance greater than said height of said spigot, said attachment pin being formed above the level of said rim of the spigot with respect to said first base portion, said second fastening portion comprising a generally flat second base portion coplanar with the strip-like connector element and formed generally centrally with an attachment aperture for receiving said attachment pin, the edge of said attachment aperture being shaped so as to include second engagement means for releasable engagement with said first engagement means of said attachment pin, whereby said spigot and attachment pin are insertable through aligned apertures of a stack of sheet members from one side of the stack, said connector element being then bendable around an edge of the stack to position said second fastening portion on the other side of the stack, and the attachment pin being then insertable into the attachment aperture of said second fastening portion so as to bring said first and second engagement means into mutual engagement, the engagement of said peripheral surface of said spigot with said inside edges of said apertures serving to inhibit relative slipping movement of the sheet members.

2. A fastening device according to claim 1, wherein: said attachment pin has an enlarged head portion which constitutes said first engagement means and said attachment aperture has a diameter smaller than diameter of said head portion so that as the head portion is pushed into the attachment aperture the head portion passes through said attachment aperture with a snap action and the edges of said attachment aperture are thereafter releasably held behind said head portion.

3. A fastening device according to claim 2 wherein: the spigot element has a central axis and comprises an axially projecting lower portion contiguous with the first base portion and formed with a circumferentially extending wall for engaging in the aligned apertures of the sheet members, and a retaining portion comprising a plurality of radially disposed circumferentially spaced elements extending axially away from the lower portion in a direction transverse to the plane of the first plate portion and having radially outer edges or surfaces which continue in said direction from said wall portion, said attachment aperture in said second fastening portion having circumferentially spaced radially disposed aperture portions for receiving said elements of the retaining portion of the spigot element, the arrangement being thereby such as to be devoid of any circumferentially extending gap between the spigot element and the second fastening portion when the two are mutually attached.

4. A method of releasably and nonslidably securing together a stack of printing plates each of which is provided with a plurality of apertures for location of the plates in a printing apparatus, the method comprising the steps of:

assembling the stack of printing plates with their corresponding apertures aligned in sets; and passing through a corresponding first set of said aligned apertures of said stack of printing plates from one side thereof a correspondingly shaped and sized cylindrical portion of a first fastening element of a first fastening device, the fastening device having said first fastening element thereof connected by a flexible elongate joining section to a second fastening element that is shaped and sized to pressingly and detachably engage with said first fastening element;

bending said flexible elongate joining section to approach said second fastening element to said first fastening element from an opposite side of said stack of printing plates;

pressing said first and second fastening elements into secure engagement with each other, through said first set of aligned apertures, so as to hold said stack of printing plates therebetween.

5. A method according to claim 4, comprising the further step of:

repeating the preceding steps with a second fastening device like the first fastening device, to nonslidingly fasten said stack of printing plates thereby through a second set of said aligned apertures.

* * * * *